(12) United States Patent
Zhao et al.

(10) Patent No.: US 11,451,727 B2
(45) Date of Patent: Sep. 20, 2022

(54) PIXEL CIRCUIT, DRIVING METHOD THEREOF, ARRAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yu Zhao, Beijing (CN); Yanchen Li, Beijing (CN); Xianwei Sui, Beijing (CN); Mengmeng Ma, Beijing (CN); Dawei Feng, Beijing (CN); Hailong Wang, Beijing (CN)

(73) Assignees: BEIJING BOE OPTOELECTRONICS TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 294 days.

(21) Appl. No.: 16/704,537

(22) Filed: Dec. 5, 2019

(65) Prior Publication Data
US 2020/0314367 A1  Oct. 1, 2020

(30) Foreign Application Priority Data
Mar. 27, 2019 (CN) .......................... 201910237982.9

(51) Int. Cl.
*H05G 1/64* (2006.01)
*H04N 5/357* (2011.01)
*G09G 3/22* (2006.01)
(Continued)

(52) U.S. Cl.
CPC ........... *H04N 5/357* (2013.01); *G01T 1/2018* (2013.01); *G09G 3/22* (2013.01);
(Continued)

(58) Field of Classification Search
CPC ...... H04N 5/357; H04N 5/32; H04N 5/37455; H04N 5/378; H04N 5/3577; H04N 5/3745;
(Continued)

(56) References Cited

U.S. PATENT DOCUMENTS 9,520,411 B2   12/2016   Takahashi et al.
10,332,912 B2   6/2019   Takahashi et al.
(Continued)

FOREIGN PATENT DOCUMENTS

CN   102598095 A   7/2012
CN   108447941 A   8/2018
(Continued)

OTHER PUBLICATIONS

First Office Action, including Search Report, for Chinese Patent Application No. 201910237982.9, dated Sep. 6, 2021, 18 pages.

*Primary Examiner* — Kiho Kim
(74) *Attorney, Agent, or Firm* — Westman, Champlin & Koehler, P.A.

(57) ABSTRACT

A pixel circuit, a driving method thereof, an array substrate, and a display device are provided. The pixel circuit includes signal inputting sub-circuit, signal reading sub-circuit, and photosensitive element. The signal inputting sub-circuit is configured to: under control of inputting control terminal, turn on coupling between signal inputting terminal and first terminal of photosensitive element in signal writing period, and turn off coupling between signal inputting terminal and first terminal of photosensitive element in exposure period and signal reading period. The signal reading sub-circuit is configured to: under control of reading control terminal, turn off coupling between first terminal of photosensitive element and signal reading terminal in signal writing period and exposure period, and turn on coupling between first terminal of photosensitive element and signal reading terminal in
(Continued)

signal reading period. Second terminal of photosensitive element is coupled to common electrode signal inputting terminal.

17 Claims, 3 Drawing Sheets

(51) Int. Cl.
   *H04N 5/3745* (2011.01)
   *H04N 5/32* (2006.01)
   *H04N 5/378* (2011.01)
   *H01L 27/146* (2006.01)
   *G01T 1/20* (2006.01)

(52) U.S. Cl.
   CPC ......... *H01L 27/14658* (2013.01); *H04N 5/32* (2013.01); *H04N 5/378* (2013.01); *H04N 5/37455* (2013.01)

(58) Field of Classification Search
   CPC .................... G01T 1/2018; G09G 3/22; G09G 2360/144; G09G 3/20; H01L 27/14658
   See application file for complete search history.

(56) References Cited

U.S. PATENT DOCUMENTS

| | | | |
|---|---|---|---|
| 10,345,458 | B2 | 7/2019 | Chen |
| 2008/0191139 | A1* | 8/2008 | Coello ................... H04N 3/155 |
| | | | 348/E3.018 |
| 2011/0115839 | A1 | 5/2011 | Takahashi et al. |
| 2012/0153126 | A1* | 6/2012 | Oike ................. H01L 27/14625 |
| | | | 250/208.1 |
| 2015/0325171 | A1 | 11/2015 | Zhou et al. |
| 2017/0092662 | A1 | 3/2017 | Takahashi et al. |
| 2018/0103216 | A1* | 4/2018 | Sakakibara ............ H04N 5/378 |
| 2018/0231671 | A1 | 8/2018 | Chen |
| 2018/0328783 | A1* | 11/2018 | Nishihara ................. G01J 1/44 |
| 2021/0335235 | A1 | 10/2021 | Yang et al. |
| 2021/0365145 | A1 | 11/2021 | Yang et al. |

FOREIGN PATENT DOCUMENTS

| | | |
|---|---|---|
| CN | 108803932 A | 11/2018 |
| CN | 109427301 A | 3/2019 |

* cited by examiner

PIXEL CIRCUIT, DRIVING METHOD THEREOF, ARRAY SUBSTRATE AND DISPLAY DEVICE

CROSS-REFERENCE TO RELATED APPLICATION

This application claims a priority to Chinese Patent Application No. 201910237982.9 filed on Mar. 27, 2019, the disclosure of which is incorporated in its entirety by reference herein.

TECHNICAL FIELD

The present disclosure relates to the field of display technology, and in particular to a pixel circuit, a driving method thereof, an array substrate, and a display device.

BACKGROUND

X-ray detector is a commonly used medical device. At present, a new type of X-ray detector converts an X-ray diffraction signal into visible light with a scintillator, and converts the visible light into an electrical signal via a photosensitive element to realize the output of X-ray diffraction signal. The accuracy of signal reading of the X-ray detector is affected by noise.

SUMMARY

A first aspect of the present disclosure provides a pixel circuit, which includes: a signal inputting sub-circuit, a signal reading sub-circuit, and a photosensitive element;

the signal inputting sub-circuit is coupled to a signal inputting terminal, an inputting control terminal, and a first terminal of the photosensitive element, and is configured to: under control of the inputting control terminal, turn on coupling between the signal inputting terminal and the first terminal of the photosensitive element in a signal writing period, and turn off the coupling between the signal inputting terminal and the first terminal of the photosensitive element in an exposure period and a signal reading period;

the signal reading sub-circuit is coupled to the first terminal of the photosensitive element, a reading control terminal, and a signal reading terminal, and is configured to: under control of the reading control terminal, turn off coupling between the first terminal of the photosensitive element and the signal reading terminal in the signal writing period and the exposure period, and turn on the coupling between the first terminal of the photosensitive element and the signal reading terminal in the signal reading period; and a second terminal of the photosensitive element is coupled to a common electrode signal inputting terminal.

In some embodiments, the signal reading sub-circuit includes: a signal receiving module, a signal amplifying module, and a signal outputting module;

the signal receiving module is coupled to the first terminal of the photosensitive element, the reading control terminal, and an input terminal of the signal amplifying module, and is configured to: under the control of the reading control terminal, turn off the coupling between the first terminal of the photosensitive element and the input terminal of the signal amplifying module in the signal writing period and the exposure period, and turn on the coupling between the first terminal of the photosensitive element and the input terminal of the signal amplifying module in the signal reading period; and the signal outputting module is coupled to an output terminal of the signal amplifying module, the reading control terminal, and the signal reading terminal, and is configured to: under the control of the reading control terminal, turn off the coupling between the output terminal of the signal amplifying module and the signal reading terminal in the signal writing period and the exposure period, and turn on the coupling between the output terminal of the signal amplifying module and the signal reading terminal in the signal reading period.

In some embodiments, the signal amplifying module includes N transistors, a first electrode of each of the N transistors is coupled to a boost signal inputting terminal, and N is a positive integer greater than or equal to 1;

a gate electrode of a first transistor of the N transistors serves as the input terminal of the signal amplifying module, and a second electrode of an N-th transistor of the N transistors serves as the output terminal of the signal amplifying module, and among the N transistors, a gate electrode of an X-th transistor is coupled to a second electrode of an (X−1)-th transistor, where $1 < X \leq N$; and when N is greater than 1, a width-to-length ratio of a channel of the first transistor to a width-to-length ratio of a channel of the N-th transistor increase successively.

In some embodiments, the signal inputting sub-circuit includes a signal inputting transistor, a gate electrode of the signal inputting transistor is coupled to the inputting control terminal, a first electrode of the signal inputting transistor is coupled to the signal inputting terminal, and a second electrode of the signal inputting transistor is coupled to the first terminal of the photosensitive element.

In some embodiments, the signal receiving module includes a signal receiving transistor, a gate electrode of the signal receiving transistor is coupled to the reading control terminal, a first electrode of the signal receiving transistor is coupled to the first terminal of the photosensitive element, and a second electrode of the signal receiving transistor is coupled to the input terminal of the signal amplifying module; and the signal outputting module includes a signal outputting transistor, a gate electrode of the signal outputting transistor is coupled to the reading control terminal, a first electrode of the signal outputting transistor is coupled to the output terminal of the signal amplifying module, and a second electrode of the signal outputting transistor is coupled to the signal reading terminal.

In some embodiments, the pixel circuit further includes: a first noise reduction sub-circuit, coupled to a noise reduction control terminal, the input terminal of the signal amplifying module, and a first level signal inputting terminal, and configured to: under control of the noise reduction control terminal, turn on coupling between the input terminal of the signal amplifying module and the first level signal inputting terminal in the signal writing period and the exposure period, and turn off the coupling between the input terminal of the signal amplifying module and the first level signal inputting terminal in the signal reading period.

In some embodiments, the pixel circuit further includes: a second noise reduction sub-circuit, coupled to a noise reduction control terminal, the output terminal of the signal amplifying module and a first level signal inputting terminal, and configured to: under control of the noise reduction control terminal, turn on coupling between the output terminal of the signal amplifying module and the first level signal inputting terminal in the signal writing period and the exposure period, and turn off the coupling between the output terminal of the signal amplifying module and the first level signal inputting terminal in the signal reading period.

In some embodiments, the first noise reduction sub-circuit includes a first noise reduction transistor, a gate electrode of the first noise reduction transistor is coupled to the noise reduction control terminal, a first electrode of the first noise reduction transistor is coupled to the input terminal of the signal amplifying module, and a second electrode of the first noise reduction transistor is coupled to the first level signal inputting terminal.

In some embodiments, the second noise reduction sub-circuit includes a second noise reduction transistor, a gate electrode of the second noise reduction transistor is coupled to the noise reduction control terminal, a first electrode of the second noise reduction transistor is coupled to the output terminal of the signal amplifying module, and a second electrode of the second noise reduction transistor is coupled to the first level signal inputting terminal.

Based on the technical solutions of the pixel circuit described above, a second aspect of the present disclosure provides an array substrate, which includes the pixel circuits described above.

In some embodiments, the array substrate further includes: multiple data signal lines, multiple reading signal lines, multiple inputting control signal lines and multiple reading control signal lines;

the multiple pixel circuits are arranged in an array, and are divided into multiple rows of pixel circuits and multiple columns of pixel circuits;

the multiple data signal lines are in a one-to-one correspondence with the multiple columns of pixel circuits, and each of the multiple data signal lines is coupled to the signal inputting terminals coupled to the pixel circuits included in the corresponding column;

the multiple reading signal lines are in a one-to-one correspondence with the multiple columns of pixel circuits, and each of the multiple reading signal lines is coupled to the signal reading terminals coupled to the pixel circuits included in the corresponding column;

the multiple inputting control signal lines are in a one-to-one correspondence with the multiple rows of pixel circuits, and each of the multiple inputting control signal lines is coupled to the inputting control terminals coupled to the pixel circuits included in the corresponding row; and the multiple reading control signal lines are in a one-to-one correspondence with the multiple rows of pixel circuits, and each of the multiple reading control signal lines is coupled to the reading control terminals coupled to the pixel circuits included in the corresponding row.

In some embodiments, the array substrate further includes: multiple noise reduction control signal lines, multiple common electrode signal inputting lines, multiple boost signal inputting lines, and multiple first level signal inputting lines;

the multiple noise reduction control signal lines are in a one-to-one correspondence with the multiple rows of pixel circuits, and each of the multiple noise reduction control signal lines is coupled to the noise reduction control terminals coupled to the pixel circuits included in the corresponding row;

the multiple common electrode signal inputting lines are in a one-to-one correspondence with the multiple rows of pixel circuits, and each of the multiple common electrode signal inputting lines is coupled to the common electrode signal inputting terminals coupled to the pixel circuits included in the corresponding row;

the multiple boost signal inputting lines are in a one-to-one correspondence with the multiple rows of pixel circuits, and each of the multiple boost signal inputting lines is coupled to the boost signal inputting terminals coupled to the pixel circuits included in the corresponding row; and the multiple first level signal inputting lines are in a one-to-one correspondence with the multiple rows of pixel circuits, and each of the multiple first level signal inputting lines is coupled to the first level signal inputting terminals coupled to the pixel circuits included in the corresponding row.

Based on the technical solutions of the array substrate described above, a third aspect of the present disclosure provides a display device, which includes the array substrate described above.

In some embodiments, the display device further includes a display screen, and pixel units of the display screen are in a one-to-one correspondence with the multiple pixel circuits of the array substrate.

Based on the technical solutions of the pixel circuit described above, a fourth aspect of the present disclosure provides a method for driving a pixel circuit, applied to the pixel circuit described above, which includes:

in the signal writing period, turning on by the signal inputting sub-circuit under control of the inputting control terminal, the coupling between the signal inputting terminal and the first terminal of the photosensitive element, and turning off by the signal reading sub-circuit under control of the reading control terminal, the coupling between the first terminal of the photosensitive element and the signal reading terminal;

in the exposure period, turning off by the signal inputting sub-circuit under control of the inputting control terminal, the coupling between the signal inputting terminal and the first terminal of the photosensitive element, turning off by the signal reading sub-circuit under control of the reading control terminal, the coupling between the first terminal of the photosensitive element and the signal reading terminal, receiving by the photosensitive element an optical signal, converting the optical signal into an electrical signal, and outputting the electrical signal from the first terminal of the photosensitive element; and in the signal reading period, turning off by the signal inputting sub-circuit under control of the inputting control terminal, the coupling between the signal inputting terminal and the first terminal of the photosensitive element, and turning on by the signal reading sub-circuit under control of the reading control terminal, the coupling between the first terminal of the photosensitive element and the signal reading terminal.

BRIEF DESCRIPTION OF THE DRAWINGS

The accompanying drawings are used to provide a further understanding of the present disclosure and form a part of the present disclosure. The exemplary embodiments of the present disclosure and the descriptions thereof are merely intended to explain the present disclosure, and do not intend to limit the present disclosure. In the drawing.

REFERENCE SIGNS

1—signal inputting sub-circuit,
2—signal reading sub-circuit,
21—signal receiving module,
22—signal amplifying module,
23—signal outputting module,
3—photosensitive element,
41—first noise reduction sub-circuit,
42—second noise reduction sub-circuit,
M1—first transistor,
M2—second transistor, M3—third transistor,
M4—signal inputting transistor,
M5—signal receiving transistor,
M6—signal outputting transistor,
M7—first noise reduction transistor,
M8—second noise reduction transistor,
Vdata—signal inputting terminal,
Gate1—inputting control terminal,
Gate2—reading control terminal,
Read—signal reading terminal,
Vbias—common electrode signal inputting terminal,
Vboost—boost signal inputting terminal,
Gate3—noise reduction control terminal,
VGL—first level signal inputting terminal,
T1—signal writing period,
T2—exposure period,
T3—signal reading period.

DETAILED DESCRIPTION

To better clarify objects, technical solutions and advantages of embodiments of the present disclosure, the technical solutions in the embodiments of the present disclosure are described clearly and completely in conjunction with drawings in the embodiments of the present disclosure. Apparently, the described embodiments are merely a part of rather than all the embodiments of the present disclosure. All other embodiments obtained by a person ordinary skilled in the art based on the embodiments of the present disclosure without any creative efforts fall within the protection scope of the present disclosure.

In the related technologies, the X-ray detector has two processes, i.e., writing and reading, for the photosensitive element, the writing process is for charging the photosensitive element, the reading process is for reading the electrical signal converted by the photosensitive element, and the two processes of writing and reading are realized with the identical signal line. In such a manner, noise is easy to generate and the accuracy of signal reading is affected.

In view of the above, the present disclosure provides a pixel circuit, a driving method thereof, an array substrate, and a display device.

In order to further explain the pixel circuit, the driving method thereof, the array substrate, and the display device according to the embodiments of the present disclosure, detailed descriptions are provided hereinafter with reference to the accompanying drawings.

Figure 1:
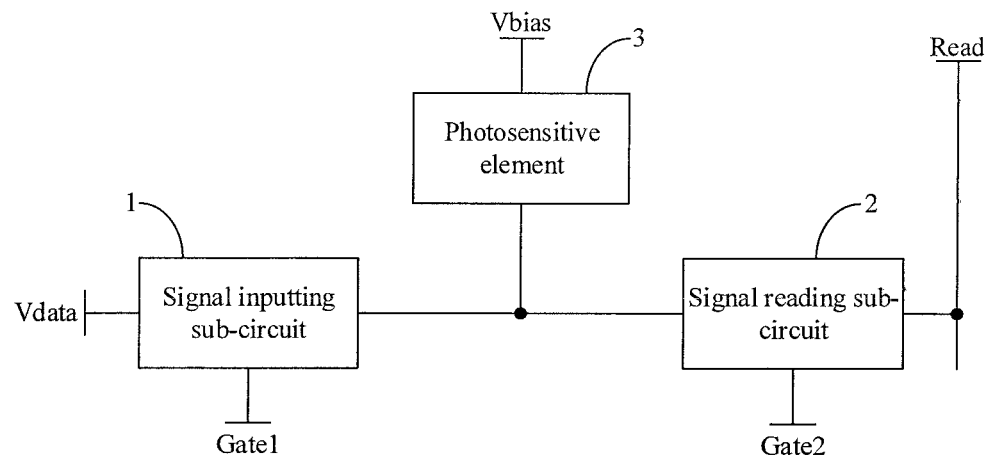
FIG. 1 is a schematic structural diagram of a pixel circuit according to some embodiments of the present disclosure.
Figure 5:
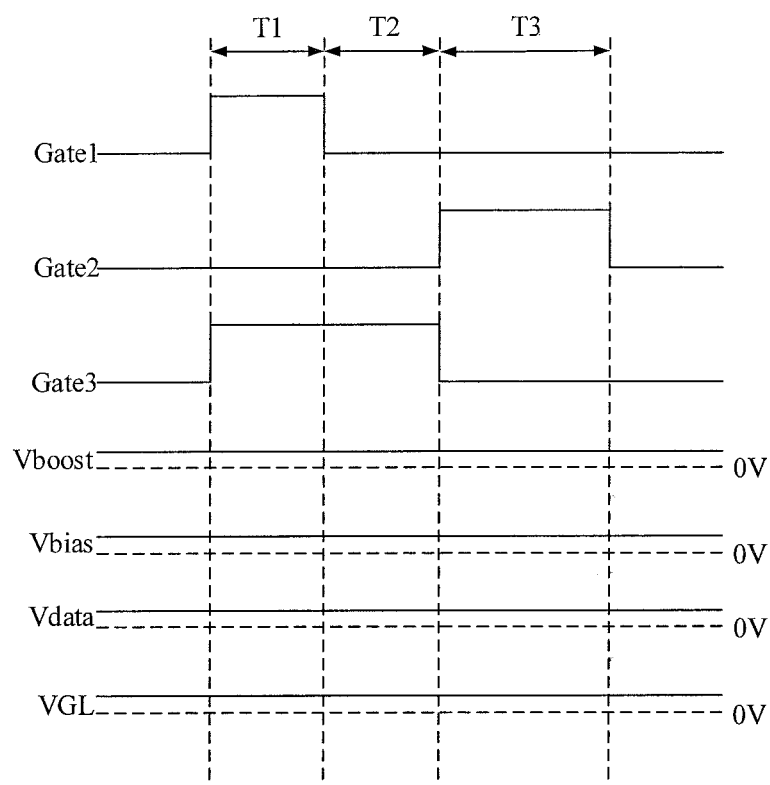
FIG. 5 is a diagram of timing of signals outputted from signal terminals according to some embodiments of the present disclosure.

Referring to FIG. 1 and FIG. 5, some embodiments of the present disclosure provide a pixel circuit, which may include: a signal inputting sub-circuit 1, a signal reading sub-circuit 2, and a photosensitive element 3.

The signal inputting sub-circuit 1 is coupled to a signal inputting terminal Vdata, a inputting control terminal Gate1, and a first terminal of the photosensitive element 3, and is configured to: under control of the inputting control terminal Gate1, turn on coupling between the signal inputting terminal Vdata and the first terminal of the photosensitive element 3 in a signal writing period T1, and turn off the coupling between the signal inputting terminal Vdata and the first terminal of the photosensitive element 3 in an exposure period T2 and a signal reading period T3.

The signal reading sub-circuit 2 is coupled to the first terminal of the photosensitive element 3, a reading control terminal Gate2, and a signal reading terminal Read, and is configured to: under control of the reading control terminal Gate2, turn off coupling between the first terminal of the photosensitive element 3 and the signal reading terminal Read in the signal writing period T1 and the exposure period T2, and turn on the coupling between the first terminal of the photosensitive element 3 and the signal reading terminal Read in the signal reading period T3.

A second terminal of the photosensitive element 3 is coupled to a common electrode signal inputting terminal Vbias.

The operating process of the above pixel circuit may be as follows.

During the signal writing period T1, a reference signal (generally a positive signal) is inputted to the signal inputting terminal Vdata. Under the control of the inputting control terminal Gate1, the signal inputting sub-circuit 1 turns on the coupling between the signal inputting terminal Vdata and the first terminal of the photosensitive element 3 to write the reference signal to the first terminal of the photosensitive element 3, a common electrode signal (generally a negative signal) is inputted to the common electrode signal inputting terminal Vbias, the second terminal of the photosensitive element 3 is coupled to the common electrode signal inputting terminal Vbias to receive the common electrode signal, and the photosensitive element 3 is charged under the combined action of the reference signal and the common electrode signal. In addition, during the signal writing period T1, under the control of the reading control terminal Gate2, the signal reading sub-circuit 2 turns off the coupling between the first terminal of the photosensitive element 3 and the signal reading terminal Read.

During the exposure period T2, under the control of the inputting control terminal Gate1, the signal inputting sub-circuit 1 turns off the coupling between the signal inputting terminal Vdata and the first terminal of the photosensitive element 3 to stop charging the photosensitive element 3; under the control of the reading control terminal Gate2, the signal reading sub-circuit 2 continues turning off the coupling between the first terminal of the photosensitive element 3 and the signal reading terminal Read; in addition, during the exposure period T2, the photosensitive element 3 is illuminated with light to make the photosensitive element 3 receive the optical signal and convert the optical signal into the electrical signal. It should be noted that the photosensitive element 3 may be a photodiode, the received light may be visible light, and the embodiments of the present disclosure are not limited thereto. When the photosensitive element 3 is a photodiode, an anode of the photodiode serves as the first terminal of the photosensitive element 3 and a cathode of the photodiode serves as the second terminal of the photosensitive element 3. In more detail, when the above pixel circuit is applied to an X-ray detector, an array substrate may be fabricated with the above pixel circuit, and a display screen may be provided on the array substrate. The pixel units in the display screen are in a one-to-one correspondence with the pixel circuits in the array substrate. When the X-ray detector is used, the X-ray detector may convert the received X-ray diffraction signal into the visible light with a scintillator, the photosensitive element 3 is irradiated with the visible light, and after the photosensitive element 3 converts the visible light into the electrical signal, the pixel units in the display screen are controlled to emit light according to the electrical signal, thereby forming a detection image with high quality.

During the signal reading period T3, under the control of the inputting control terminal Gate1, the signal inputting sub-circuit 1 continues turning off the coupling between the signal inputting terminal Vdata and the first terminal of the photosensitive element 3; under the control of the reading control terminal Gate2, the signal reading sub-circuit 2 turns on the coupling between the first terminal of the photosensitive element 3 and the signal reading terminal Read, thereby outputting the electrical signal converted by the photosensitive element 3 from the signal reading terminal Read.

It should be noted that the coupling in the embodiments of the present disclosure may include: electrical connection or signal connection.

Based on the specific structure and operation process of the pixel circuit described above, it can be understood that the pixel circuit according to the embodiments of the present disclosure includes the signal inputting sub-circuit 1 and the signal reading sub-circuit 2, where the signal inputting sub-circuit 1 is configured to control to charge the photosensitive element 3 during the signal writing period T1, and control to stop charging the photosensitive element 3 during the exposure period T2 and the signal reading period T3; and the signal reading sub-circuit 2 does not read the signal converted by the photosensitive element 3 during the signal writing period T1 and the exposure period T2, and is configured to control to read the electrical signal converted by the photosensitive element 3 during the signal reading period T3. It can be seen that, in the pixel circuit according to the embodiments of the present disclosure, the charging process and the reading process for the photosensitive element 3 are respectively controlled via different sub-circuits, avoiding interference noise and influence on accuracy of electrical signal reading caused in the case where the charging process and the reading process are realized via the identical signal line.

Therefore, the pixel circuit according to the embodiments of the present disclosure can accurately obtain the electrical signal converted by the photosensitive element 3. When the pixel circuit according to the embodiments of the present disclosure is applied to an X-ray detector, the X-ray detector can obtain a high-quality image corresponding to the electrical signal based on the electrical signal obtained via the pixel circuit, thereby effectively improving the accuracy of the X-ray detector.

Figure 2:
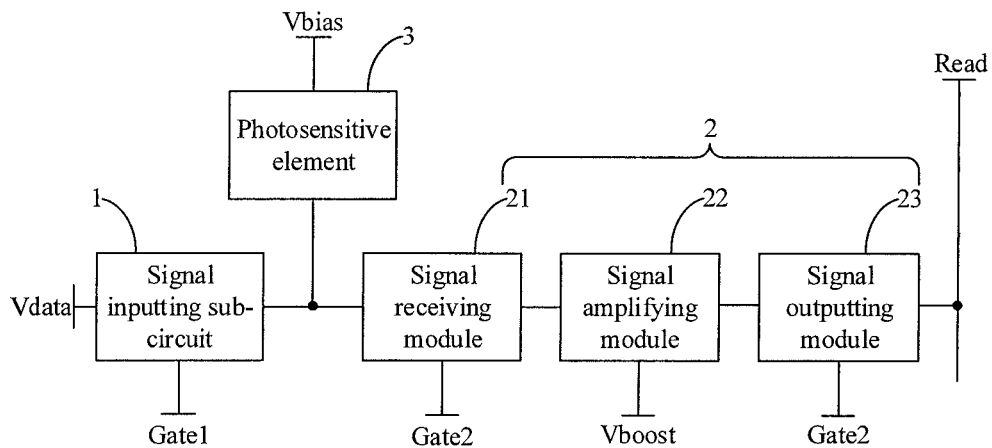
FIG. 2 is a schematic structural diagram of a pixel circuit according to some embodiments of the present disclosure.

The specific structure of the signal reading sub-circuit 2 according to the foregoing embodiment is various. For example, as shown in FIG. 2, the signal reading sub-circuit 2 may include a signal receiving module 21, a signal amplifying module 22, and a signal outputting module 23.

The signal receiving module 21 is coupled to the first terminal of the photosensitive element 3, the reading control terminal Gate2 and an input terminal of the signal amplifying module 22, and is configured to: under the control of the reading control terminal Gate2, turn off the coupling between the first terminal of the photosensitive element 3 and the input terminal of the signal amplifying module 22 in the signal writing period T1 and the exposure period T2, and turn on the coupling between the first terminal of the photosensitive element 3 and the input terminal of the signal amplifying module 22 in the signal reading period T3.

The signal outputting module 23 is coupled to an output terminal of the signal amplifying module 22, the reading control terminal Gate2, and the signal reading terminal Read, and is configured to: under the control of the reading control terminal Gate2, turn off the coupling between the output terminal of the signal amplifying module 22 and the signal reading terminal Read in the signal writing period T1 and the exposure period T2, and turn on the coupling between the output terminal of the signal amplifying module 22 and the signal reading terminal Read in the signal reading period T3.

When the signal reading sub-circuit 2 includes the above structures, its operating process may be as follows.

During the signal writing period T1 and the exposure period T2, under the control of the reading control terminal Gate2, the signal receiving module 21 turns off the coupling between the first terminal of the photosensitive element 3 and the input terminal of the signal amplifying module 22, so that the electrical signal converted by the photosensitive element 3 does not enter the signal reading sub-circuit 2 in these two periods; in addition, in these two periods, under the control of the reading control terminal Gate2, the signal outputting module 23 turns off the coupling between the output terminal of the signal amplifying module 22 and the signal reading terminal Read to prevent other interference signals from being transmitted to the signal reading terminal Read.

During the signal reading period T3, under the control of the reading control terminal Gate2, the signal receiving module 21 turns on the coupling between the first terminal of the photosensitive element 3 and the input terminal of the signal amplifying module 22, to enable the electrical signal converted by the photosensitive element 3 to be transmitted to the signal amplifying module 22 through the signal receiving module 21, and to enable the received electrical signal to be amplified by the signal amplifying module 22; under the control of the reading control terminal Gate2, the signal outputting module 23 turns on the coupling between the output terminal of the signal amplifying module 22 and the signal reading terminal Read to transmit the electrical signal amplified by the signal amplifying module 22 to the signal reading terminal Read.

When visible light is used to irradiate the photosensitive element 3, the quantity of charge corresponding to the electrical signal converted by the photosensitive element 3 is relatively small, and it is vulnerable to noise interference, so that when the electrical signal is transmitted to the signal reading terminal Read, there is a problem of difficulty in reading. In view of the above, the signal reading sub-circuit 2 described above may include: the signal receiving module 21, the signal amplifying module 22, and the signal outputting module 23. In this way, the electrical signal converted by the photosensitive element 3 can be transmitted to the signal amplifying module 22 via the signal receiving module 21, the electrical signal is amplified by the signal amplifying module 22, transmitted to the signal outputting module 23, and then transmitted to the signal reading terminal Read via the signal outputting module 23. Therefore, the signal reading sub-circuit 2 with the above structure can amplify the electrical signal converted by the photosensitive element 3 to enhance the electrical signal and improve the noise proof capability of the electrical signal, which is more beneficial to stability of a product including the pixel circuit.

Figure 4:
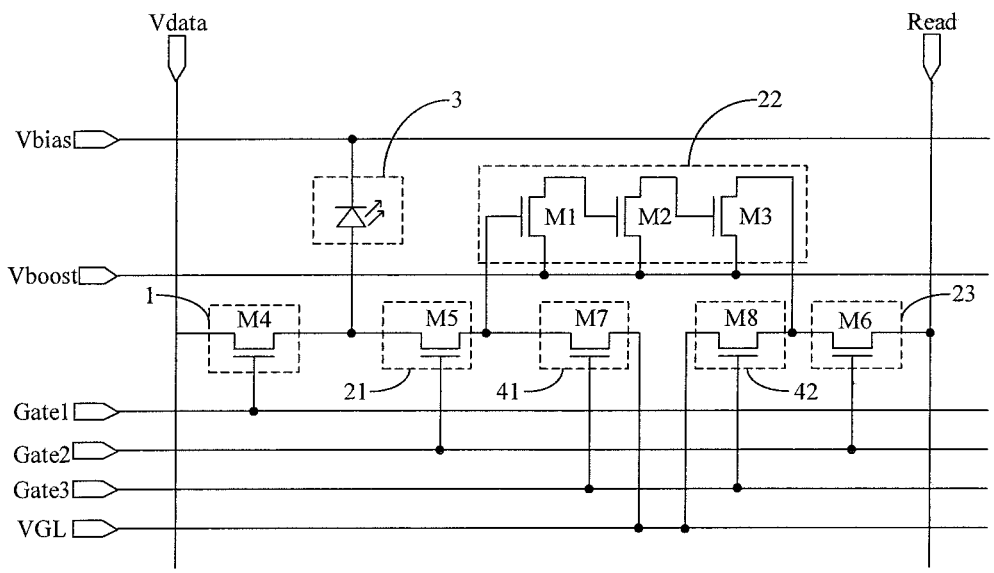
FIG. 4 is a schematic diagram of a specific structure of a pixel circuit according to some embodiments of the present disclosure.

As shown in FIG. 4, in some embodiments, the signal amplifying module 22 according to the above embodiments may include N transistors, a first electrode of each of the N transistors is coupled to a boost signal inputting terminal Vboost, and N is a positive integer greater than or equal to 1; a gate electrode of a first transistor M1 of the N transistors serves as the input terminal of the signal amplifying module 22, and a second electrode of an N-th transistor of the N transistors serves as the output terminal of the signal amplifying module 22, and among the N transistors, a gate electrode of an X-th transistor is coupled to a second electrode of an (X−1)-th transistor, where 1<X≤N; and when N is greater than 1, a width-to-length ratio of a channel of the first transistor to a width-to-length ratio of a channel of the N-th transistor increase successively.

Specifically, a case where the signal amplifying module 22 includes three transistors is taken as an example. The specific structure of the signal amplifying module 22 is as follows: the signal amplifying module 22 includes a first transistor M1, a second transistor M2, and a third transistor M3, where the gate electrode of the first transistor M1 serves as the input terminal of the signal amplifying module 22, the first electrode of the first transistor M1 is coupled to the boost signal inputting terminal Vboost, the second electrode of the first transistor M1 is coupled to the gate electrode of the second transistor M2, the first electrode of the second transistor M2 is coupled to the boost signal inputting terminal Vboost, the second electrode of the second transistor M2 is coupled to the gate electrode of the third transistor M3, the first electrode of the third transistor M3 is coupled to the boost signal inputting terminal Vboost, and the second electrode of the third transistor M3 serves as the output terminal of the signal amplifying module 22.

The specific operating process of the above-mentioned signal amplifying module 22 may be as follows. During the signal reading period T3, under the control of the reading control terminal Gate2, the signal receiving module 21 turns on the coupling between the first terminal of the photosensitive element 3 and the gate electrode of the first transistor M1, to enable the electrical signal converted by the photosensitive element 3 to be transmitted to the gate electrode of the first transistor M1, so that the first transistor M1 is turned on under the control of the electrical signal; in addition, an original boost signal is inputted to the boost signal inputting terminal Vboost, the first transistor M1 outputs a first proportional boost signal from the second electrode of the first transistor M1 according to its own width-to-length ratio of channel, the first proportional boost signal is transmitted to the gate electrode of the second transistor M2 to control the second transistor M2 to be turned on so as to enable the second transistor M2 to output a second proportional boost signal from the second electrode of the second transistor M2 according to its own width-to-length ratio of channel, the second proportional boost signal is transmitted to the gate electrode of the third transistor M3 to control the third transistor M3 to be turned on so as to enable the third transistor M3 to output a third proportional boost signal from the second electrode of the third transistor M3 according to its own width-to-length ratio of channel; moreover, under the control of the reading control terminal Gate2, the signal outputting module 23 turns on the coupling between the output terminal (i.e., the second electrode of the third transistor M3) of the signal amplifying module 22 and the signal reading terminal Read to transmit the third proportional boost signal to signal reading terminal Read.

It should be noted that, the original boost signal inputted from the boost signal inputting terminal Vboost is greater than the electrical signal converted by the photosensitive element 3, and when N is greater than 1, the width-to-length ratio of the channel of the first transistor M1 to the width-to-length ratio of the channel of the N-th transistor gradually increase, thus, the first proportional boost signal is smaller than the second proportional boost signal, the second proportional boost signal is smaller than the third proportional boost signal, and the third proportional boost signal is larger than the electrical signal obtained by the photosensitive element 3. In this way, the electrical signal obtained through the conversion of the photosensitive element 3 is amplified.

When the signal amplifying module 22 has the above structure, the electrical signal obtained through the conversion of the photosensitive element 3 can be amplified step by step by the N transistors, and finally outputted from the output terminal of the signal amplifying module 22. For the signal amplifying module 22 with the above structure, the number of transistors may be set according to actual needs, so as to control the degree of amplification of the electrical signal converted by the photosensitive element 3.

Referring to FIG. 4 and FIG. 5, in some embodiments, the signal inputting sub-circuit 1 according to the above embodiments may include: a signal inputting transistor M4, a gate electrode of the signal inputting transistor M4 is coupled to the inputting control terminal Gate1, a first electrode of the signal inputting transistor M4 is coupled to the signal inputting terminal Vdata, and a second electrode of the signal inputting transistor M4 is coupled to the first terminal of the photosensitive element 3; the signal receiving module 21 according to the above embodiments may include: a signal receiving transistor M5, a gate electrode of the signal receiving transistor M5 is coupled to the reading control terminal Gate2, a first electrode of the signal receiving transistor M5 is coupled to the first terminal of the photosensitive element 3, and a second electrode of the signal receiving transistor M5 is coupled to the input terminal of the signal amplifying module 22; and the signal outputting module 23 according to the above embodiments may include: a signal outputting transistor M6, a gate electrode of the signal outputting transistor M6 is coupled to the reading control terminal Gate2, a first electrode of the signal outputting transistor M6 is coupled to the output terminal of the signal amplifying module 22, and a second electrode of the signal outputting transistor M6 is coupled to the signal reading terminal Read.

Specifically, when the signal inputting sub-circuit 1, the signal receiving module 21, and the signal outputting module 23 adopt the above structures, the specific operating process of the pixel circuit according to the above embodiments may be as follows.

During the signal writing period T1, a reference signal is inputted to the signal inputting terminal Vdata, under the control of the inputting control terminal Gate1, the signal inputting transistor M4 is turned on to turn on the coupling between the signal inputting terminal Vdata and the first terminal of the photosensitive element 3, so as to write the reference signal to the first terminal of the photosensitive element 3, the common electrode signal is inputted to the common electrode signal inputting terminal Vbias, the second terminal of the photosensitive element 3 is coupled to the common electrode signal inputting terminal Vbias and receives the common electrode signal, and photosensitive element 3 is charged under the combined action of the reference signal and the common electrode signal; in addition, during the signal writing period T1, under the control of the reading control terminal Gate2, the signal receiving transistor M5 and the signal outputting transistor M6 are turned off, so as to turn off the coupling between the first terminal of the photosensitive element 3 and the signal reading terminal Read.

During the exposure period T2, under the control of the inputting control terminal Gate1, the signal inputting transistor M4 is turned off so as to turn off the coupling between the signal inputting terminal Vdata and the first terminal of the photosensitive element 3 to stop charging the photosensitive element 3; under the control of the reading control terminal Gate2, the signal receiving transistor M5 and the signal outputting transistor M6 continue to be in an turn-off state, so as to continue to turn off the coupling between the first terminal of the photosensitive element 3 and the signal reading terminal Read; furthermore, in the exposure period T2, the photosensitive element 3 is irradiated with light to make the photosensitive element 3 to receive the optical signal and convert the optical signal into the electrical signal.

During the signal reading period T3, under the control of the inputting control terminal Gate1, the signal inputting transistor M4 continues to be in an turn-off state, so as to continue to turn off the coupling between the signal inputting terminal Vdata and the first terminal of the photosensitive element 3; under the control of the reading control terminal Gate2, the signal receiving transistor M5 and the signal outputting transistor M6 are turned on, so as to turn on the coupling between the first terminal of the photosensitive element 3 and the signal reading terminal Read, to output the electrical signal converted by the photosensitive element 3 from the signal reading terminal Read.

Figure 3:
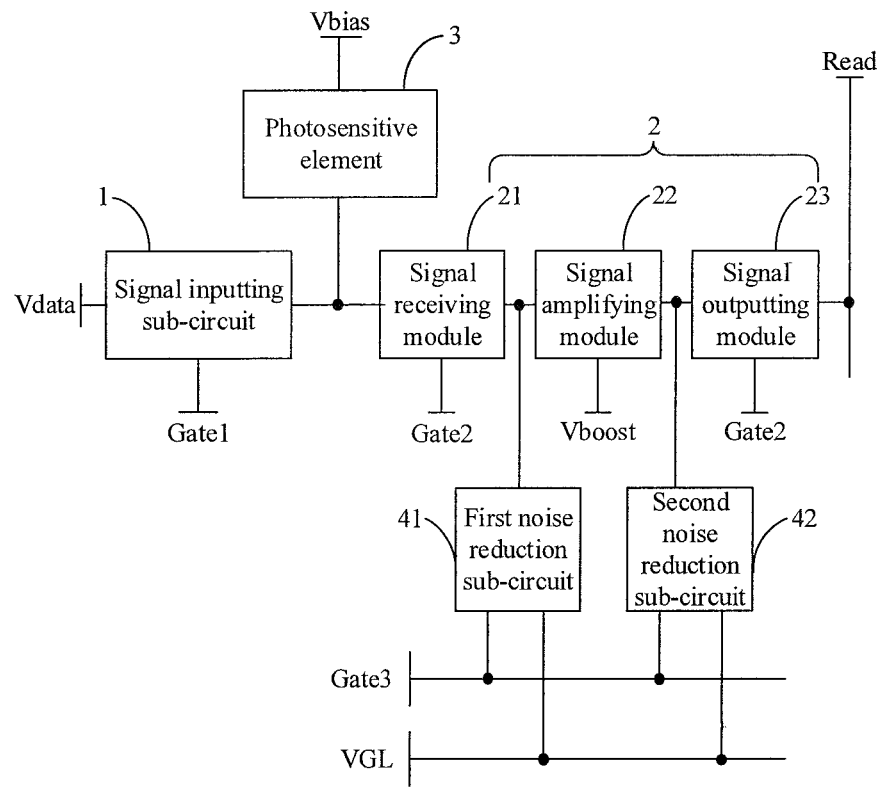
FIG. 3 is a schematic structural diagram of a pixel circuit according to some embodiments of the present disclosure.

In some embodiments, the pixel circuit according to the above embodiments may further include: a first noise reduction sub-circuit 41 and/or a second noise reduction sub-circuit 42. As shown in FIG. 3, the pixel circuit includes the first noise reduction sub-circuit 41 and the second noise reduction sub-circuit 42. The first noise reduction sub-circuit 41 is coupled to a noise reduction control terminal Gate3, the input terminal of the signal amplifying module 22, and a first level signal inputting terminal VGL, and is configured to: under control of the noise reduction control terminal Gate3, turn on coupling between the input terminal of the signal amplifying module 22 and the first level signal inputting terminal VGL in the signal writing period T1 and the exposure period T2, and turn off the coupling between the input terminal of the signal amplifying module 22 and the first level signal inputting terminal VGL in the signal reading period T3. The second noise reduction sub-circuit 42 is coupled to the noise reduction control terminal Gate3, the output terminal of the signal amplifying module 22 and the first level signal inputting terminal VGL, and is configured to: under control of the noise reduction control terminal Gate3, turn on coupling between the output terminal of the signal amplifying module 22 and the first level signal inputting terminal VGL in the signal writing period T1 and the exposure period T2, and turn off the coupling between the output terminal of the signal amplifying module 22 and the first level signal inputting terminal VGL in the signal reading period T3.

The specific operating process of the first noise reduction sub-circuit 41 and the second noise reduction sub-circuit 42 may be as follows.

During the signal writing period T1 and the exposure period T2, under the control of the noise reduction control terminal Gate3, the first noise reduction sub-circuit 41 turns on the coupling between the input terminal of the signal amplifying module 22 and the first level signal inputting terminal VGL; and/or, under the control of the noise reduction control terminal Gate3, the second noise reduction sub-circuit 42 turns on the coupling between the output terminal of the signal amplifying module 22 and the first level signal inputting terminal VGL.

During the signal reading period T3, under the control of the noise reduction control terminal Gate3, the first noise reduction sub-circuit 41 turns off the coupling between the input terminal of the signal amplifying module 22 and the first level signal inputting terminal VGL; and/or, under the control of the noise reduction control terminal Gate3, the second noise reduction sub-circuit 42 turns off the coupling between the output terminal of the signal amplifying module 22 and the first level signal inputting terminal VGL.

The pixel circuit according to the above embodiments includes the first noise reduction sub-circuit 41 and/or the second noise reduction sub-circuit 42. In this way, the input terminal and/or the output terminal of the signal amplifying module 22 can be coupled to the first level signal inputting terminal VGL in periods other than the signal reading period T3, so that the potential(s) of the input terminal and/or output terminal of the signal amplifying module 22 can be maintained as the potential of the first level signal inputted from the first level signal inputting terminal VGL, which well reduces the internal noise of the signal reading sub-circuit 2.

Further, the first noise reduction sub-circuit 41 according to the above embodiments may include a first noise reduction transistor M7, a gate electrode of the first noise reduction transistor M7 is coupled to the noise reduction control terminal Gate3, a first electrode of the first noise reduction transistor M7 is coupled to the input terminal of the signal amplifying module 22, and a second electrode of the first noise reduction transistor M7 is coupled to the first level signal inputting terminal VGL. The second noise reduction sub-circuit 42 according to the above embodiments may include a second noise reduction transistor M8, a gate electrode of the second noise reduction transistor M8 is coupled to the noise reduction control terminal Gate3, a first electrode of the second noise reduction transistor M8 is coupled to the output terminal of the signal amplifying module 22, and a second electrode of the second noise reduction transistor M8 is coupled to the first level signal inputting terminal VGL.

When the first noise reduction sub-circuit 41 and the second noise reduction sub-circuit 42 adopt the above structures, the specific operating process of the first noise reduction sub-circuit 41 and the second noise reduction sub-circuit 42 may be as follows.

During the signal writing period T1 and the exposure period T2, under the control of the noise reduction control terminal Gate3, the first noise reduction transistor M7 is turned on, so as to turn on the coupling between the input terminal of the signal amplifying module 22 and the first level signal inputting terminal VGL; and/or, under the control of the noise reduction control terminal Gate3, the second noise reduction transistor M8 is turned on, so as to turn on the coupling between the output terminal of the signal amplifying module 22 and the first level signal inputting terminal VGL.

During the signal reading period T3, under the control of the noise reduction control terminal Gate3, the first noise reduction transistor M7 is turned off, so as to turn off the coupling between the input terminal of the signal amplifying module 22 and the first level signal inputting terminal VGL; and/or, under the control of the noise reduction control terminal Gate3, the second noise reduction transistor M8 is turned off, so as to turn off the coupling between the output terminal of the signal amplifying module 22 and the first level signal inputting terminal VGL.

It should be noted that, the first transistor M1 to the N-th transistor, the signal inputting transistor M4, the signal receiving transistor M5, the signal outputting transistor M6, the first noise reduction transistor M7, and the second noise reduction transistor M8 mentioned in the above embodiments each may be an N-type thin film transistor or a P-type thin film transistor, which are selected based on actual conditions. In addition, for the various transistors mentioned in the above embodiments, the first electrode may be a source electrode and the second electrode may be a drain electrode, or, for the various transistors mentioned in the above embodiments, the first electrode may be a drain electrode and the second electrode may be a source electrode.

Some embodiments of the present disclosure further provide an array substrate, including the pixel circuit according to the above embodiments.

The array substrate according to the embodiments of the present disclosure includes multiple pixel circuits according to the above embodiments, and the multiple pixel circuits may be arranged in an array. When the array substrate according to the embodiments of the present disclosure is applied to an X-ray detector, a display screen may be provided on the array substrate, and pixel units in the display screen are in a one-to-one correspondence with the pixel circuits in the array substrate.

When the X-ray detector is used, the X-ray detector may convert the received X-ray diffraction signal into the visible light with a scintillator, the photosensitive element 3 is irradiated with the visible light, and after the photosensitive element 3 converts the visible light into the electrical signal, the pixel units in the display screen are controlled to emit light according to the electrical signal, thereby forming a detection image with high quality.

Since the pixel circuit according to the above embodiments can accurately obtain the electrical signal converted by the photosensitive element 3, the array substrate according to the embodiments of the present disclosure also has the above-mentioned beneficial effects when including the above-mentioned pixel circuit. When the array substrate according to the embodiments of the present disclosure is applied to an X-ray detector, the X-ray detector can obtain a high-quality image corresponding to the electrical signal based on the electrical signal obtained via the pixel circuit, thereby effectively improving the accuracy of the X-ray detector.

In some embodiments, the array substrate according to the above embodiments further includes: multiple data signal lines, multiple reading signal lines, multiple inputting control signal lines, and multiple reading control signal lines. The multiple pixel circuits are arranged in an array, and can be divided into multiple rows of pixel circuits and multiple columns of pixel circuits.

The multiple data signal lines are in a one-to-one correspondence with the multiple columns of pixel circuits, and each of the multiple data signal lines is coupled to the signal inputting terminals coupled to the pixel circuits included in the corresponding column.

The multiple reading signal lines are in a one-to-one correspondence with the multiple columns of pixel circuits, and each of the multiple reading signal lines is coupled to the signal reading terminals coupled to the pixel circuits included in the corresponding column.

The multiple inputting control signal lines are in a one-to-one correspondence with the multiple rows of pixel circuits, and each of the multiple inputting control signal lines is coupled to the inputting control terminals coupled to the pixel circuits included in the corresponding row.

The multiple reading control signal lines are in a one-to-one correspondence with the multiple rows of pixel circuits, and each of the multiple reading control signal lines is coupled to the reading control terminals coupled to the pixel circuits included in the corresponding row.

Specifically, the multiple pixel circuits included in the array substrate are arranged in an array, and the pixel circuits in the identical row may reuse the identical inputting control signal line, and the pixel circuits in the identical row may reuse the identical reading control signal line; and the pixel circuits in the identical column may reuse the identical data signal line, and the pixel circuits in the identical column may reuse the identical reading signal line.

In some embodiments, the array substrate according to the above embodiments may further include: multiple noise reduction control signal lines, multiple common electrode signal inputting lines, multiple boost signal inputting lines, and multiple first level signal inputting lines.

The multiple noise reduction control signal lines are in a one-to-one correspondence with the multiple rows of pixel circuits, and each of the multiple noise reduction control signal lines is coupled to the noise reduction control terminals coupled to the pixel circuits included in the corresponding row.

The multiple common electrode signal inputting lines are in a one-to-one correspondence with the multiple rows of pixel circuits, and each of the multiple common electrode signal inputting lines is coupled to the common electrode signal inputting terminals coupled to the pixel circuits included in the corresponding row.

The multiple boost signal inputting lines are in a one-to-one correspondence with the multiple rows of pixel circuits, and each of the multiple boost signal inputting lines is coupled to the boost signal inputting terminals coupled to the pixel circuits included in the corresponding row.

The multiple first level signal inputting lines are in a one-to-one correspondence with the multiple rows of pixel circuits, and each of the multiple first level signal inputting lines is coupled to the first level signal inputting terminals coupled to the pixel circuits included in the corresponding row.

When the above array substrate is in actual operation, the pixel circuits are scanned row by row by the inputting control signal lines and the reading control signal lines. Hereinafter, scanning of a first row of pixel circuits in the multiple rows of pixel circuits is taken as an example to illustrate the operating process of the array substrate.

During the signal writing period T1, the inputting control signal line (hereinafter referred to as a first inputting control signal line) corresponding to the first row of pixel circuits writes an inputting control signal having an active level to each of the inputting control terminals coupled to the first row of pixel circuits, under the control of the inputting control signal, each pixel circuit in the first row of pixel circuits turns on the coupling between the signal inputting terminal Vdata and the first terminal of the photosensitive element 3; in addition, each of all data signal lines in the array substrate is controlled to write a reference signal to the corresponding signal inputting terminal Vdata, so as to write the reference signal to the first terminal of each of the photosensitive elements 3 included in the first row of pixel circuits; the common electrode signal is inputted to the common electrode signal inputting terminal Vbias, and the second terminal of each of the photosensitive elements 3 included in the first row of pixel circuits receives the common electrode signal, and each of the photosensitive element 3 in the first row of pixel circuits is charged under the combined action of the reference signal and the common electrode signal.

During the exposure period T2, the first inputting control signal line writes an inputting control signal having an inactive level to each of the inputting control terminals Gate1 coupled to the first row of pixel circuits; under the control of the inputting control terminal Gate1, each of the first row of pixel circuits turns off the coupling between the signal inputting terminal Vdata and the first terminal of the photosensitive element 3 to stop charging each of the photosensitive elements 3 in the first row of pixel circuits; in addition, during the exposure period T2, the photosensitive elements 3 in the first row of pixel circuits are illuminated with light to enable the photosensitive elements 3 receive the optical signals and convert the optical signals into the electrical signals.

During the signal reading period T3, the first inputting control signal line writes the inputting control signal having the inactive level to each of the inputting control terminals coupled to the first row of pixel circuits; under the control of the inputting control terminal Gate1, each of the first row of pixel circuits turns off the coupling between the signal inputting terminal Vdata and the first terminal of the photosensitive element 3; in addition, the reading control signal line (hereinafter referred to as a first reading control signal line) corresponding to the first row of pixel circuits writes a reading control signal having an active level to each of the reading control terminals Gate2 coupled to the first row of pixel circuits, under the control of the reading control signal, each of the first row of pixel circuits turns on the coupling between the first terminal of the photosensitive element 3 and the signal reading terminal Read, so as to output the electrical signal converted by the photosensitive element 3 from the signal reading terminal Read via the corresponding reading signal line. In this way, reading of the electrical signals converted by the photosensitive elements 3 in the first row of pixel circuits is achieved.

Some embodiments of the present disclosure further provide a display device, including the array substrate according to the above embodiments.

Since the array substrate according to the above embodiment cans accurately obtain the electrical signal converted by the photosensitive element 3, the display device according to the embodiments of the present disclosure also has the above-mentioned beneficial effects when including the above-mentioned array substrate. When the display device according to the embodiments of the present disclosure is applied to an X-ray detector, the X-ray detector can obtain a high-quality image corresponding to the electrical signal based on the electrical signal obtained via the pixel circuit in the array substrate of the display device, thereby effectively improving the accuracy of the X-ray detector.

In some embodiments, the display device includes a display screen, and pixel units of the display screen are in a one-to-one correspondence with the pixel circuits of the array substrate.

Some embodiments of the present disclosure further provide a method for driving a pixel circuit, which is applied to the pixel circuit according to the above embodiments. The method may include:

during the signal writing period T1, turning on by the signal inputting sub-circuit 1 under control of the inputting control terminal Gate1, the coupling between the signal inputting terminal Vdata and the first terminal of the photosensitive element 3, and turning off by the signal reading sub-circuit 2 under control of the reading control terminal Gate2, the coupling between the first terminal of the photosensitive element Sand the signal reading terminal Read;

during the exposure period T2, turning off by the signal inputting sub-circuit 1 under control of the inputting control terminal Gate1, the coupling between the signal inputting terminal Vdata and the first terminal of the photosensitive element 3, turning off by the signal reading sub-circuit 2 under control of the reading control terminal Gate2, the coupling between the first terminal of the photosensitive element 3 and the signal reading terminal Read, receiving by the photosensitive element 3 an optical signal, converting the optical signal into an electrical signal, and outputting the electrical signal from the first terminal of the photosensitive element 3; and during the signal reading period T3, turning off by the signal inputting sub-circuit 1 under control of the inputting control terminal Gate1, the coupling between the signal inputting terminal Vdata and the first terminal of the photosensitive element 3, and turning on by the signal reading sub-circuit 2 under control of the reading control terminal Gate2, the coupling between the first terminal of the photosensitive element 3 and the signal reading terminal Read.

Specifically, during the signal writing period T1, a reference signal (generally a positive signal) is inputted to the signal inputting terminal Vdata. Under the control of the inputting control terminal Gate1, the signal inputting sub-circuit 1 turns on the coupling between the signal inputting terminal Vdata and the first terminal of the photosensitive element 3 to write the reference signal to the first terminal of the photosensitive element 3, a common electrode signal (generally a negative signal) is inputted to the common electrode signal inputting terminal Vbias, the second terminal of the photosensitive element 3 is coupled to the common electrode signal inputting terminal Vbias to receive the common electrode signal, and the photosensitive element 3 is charged under the combined action of the reference signal and the common electrode signal. In addition, during the signal writing period T1, under the control of the reading control terminal Gate2, the signal reading sub-circuit 2 turns off the coupling between the first terminal of the photosensitive element 3 and the signal reading terminal Read.

During the exposure period T2, under the control of the inputting control terminal Gate1, the signal inputting sub-circuit 1 turns off the coupling between the signal inputting terminal Vdata and the first terminal of the photosensitive element 3 to stop charging the photosensitive element 3; under the control of the reading control terminal Gate2, the signal reading sub-circuit 2 continues turning off the coupling between the first terminal of the photosensitive element 3 and the signal reading terminal Read; in addition, during the exposure period T2, the photosensitive element 3 is illuminated with light to make the photosensitive element 3 receive the optical signal and convert the optical signal into the electrical signal.

During the signal reading period T3, under the control of the inputting control terminal Gate1, the signal inputting sub-circuit 1 continues turning off the coupling between the signal inputting terminal Vdata and the first terminal of the photosensitive element 3; under the control of the reading control terminal Gate2, the signal reading sub-circuit 2 turns on the coupling between the first terminal of the photosensitive element 3 and the signal reading terminal Read, thereby outputting the electrical signal converted by the photosensitive element 3 from the signal reading terminal Read.

When the above-mentioned pixel circuit is driven with the method according to the embodiments of the present disclosure, the charging process and the reading process for the photosensitive element 3 are respectively controlled via different sub-circuits, avoiding interference noise and influence on accuracy of electrical signal reading caused in the case where the charging process and the reading process are realized via the identical signal line. Therefore, when the pixel circuit is driven by the method according to the embodiments of the present disclosure, the electrical signal converted by the photosensitive element 3 can be accurately obtained. In this way, when the pixel circuit according to the embodiments of the present disclosure is applied in an X-ray detector, the X-ray detector can obtain a high-quality image corresponding to the electrical signal based on the electrical signal obtained by the pixel circuit, thereby effectively improving the accuracy of the X-ray detector.

In some embodiments, when the signal reading sub-circuit 2 includes a signal receiving module 21, a signal amplifying module 22, and a signal outputting module 23, the driving process of the signal reading sub-circuit 2 may be as follows.

During the signal writing period T1 and the exposure period T2, under the control of the reading control terminal Gate2, the signal receiving module 21 turns off the coupling between the first terminal of the photosensitive element 3 and the input terminal of the signal amplifying module 22, and under the control of the reading control terminal Gate2, the signal outputting module 23 turns off the coupling between the output terminal of the signal amplifying module 22 and the signal reading terminal Read.

During the signal reading period T3, under the control of the reading control terminal Gate2, the signal receiving module 21 turns on the coupling between the first terminal of the photosensitive element 3 and the input terminal of the signal amplifying module 22; and under the control of the reading control terminal Gate2, the signal outputting module 23 turns on the coupling between the output terminal of the signal amplifying module 22 and the signal reading terminal Read.

In more detail, during the signal writing period T1 and the exposure period T2, under the control of the reading control terminal Gate2, the signal receiving module 21 turns off the coupling between the first terminal of the photosensitive element 3 and the input terminal of the signal amplifying module 22, so that the electrical signal converted by the photosensitive element 3 does not enter the signal reading sub-circuit 2 in these two periods; in addition, in these two periods, under the control of the reading control terminal Gate2, the signal outputting module 23 turns off the coupling between the output terminal of the signal amplifying module 22 and the signal reading terminal Read to prevent other interference signals from being transmitted to the signal reading terminal Read.

During the signal reading period T3, under the control of the reading control terminal Gate2, the signal receiving module 21 turns on the coupling between the first terminal of the photosensitive element 3 and the input terminal of the signal amplifying module 22, to enable the electrical signal converted by the photosensitive element 3 to be transmitted to the signal amplifying module 22 through the signal receiving module 21, and to enable the received electrical signal to be amplified by the signal amplifying module 22; and under the control of the reading control terminal Gate2, the signal outputting module 23 turns on the coupling between the output terminal of the signal amplifying module 22 and the signal reading terminal Read to transmit the electrical signal amplified by the signal amplifying module 22 to the signal reading terminal Read.

When visible light is used to irradiate the photosensitive element 3, the quantity of charge corresponding to the electrical signal converted by the photosensitive element 3 is relatively small, and it is vulnerable to noise interference, so that when the electrical signal is transmitted to the signal reading terminal Read, there is a problem of difficulty in reading. In view of the above, the signal reading sub-circuit 2 described above may include: the signal receiving module 21, the signal amplifying module 22, and the signal outputting module 23, and the method according to the above embodiments is adopted to drive the signal reading sub-circuit 2. In this way, the electrical signal converted by the photosensitive element 3 can be transmitted to the signal amplifying module 22 via the signal receiving module 21, the electrical signal is amplified by the signal amplifying module 22, transmitted to the signal outputting module 23, and then transmitted to the signal reading terminal Read via the signal outputting module 23. Therefore, the signal reading sub-circuit 2 can amplify the electrical signal converted by the photosensitive element 3 to enhance the electrical signal and improve the noise proof capability of the electrical signal, which is more beneficial to stability of a product including the pixel circuit.

In some embodiments, when the pixel circuit includes the first noise reduction sub-circuit 41 and/or the second noise reduction sub-circuit 42, the method according to the above embodiment may further include:

during the signal writing period T1 and the exposure period T2, under the control of the noise reduction control terminal Gate3, the first noise reduction sub-circuit 41 turns on the coupling between the input terminal of the signal amplifying module 22 and the first level signal inputting terminal VGL; and/or, under the control of the noise reduction control terminal Gate3, the second noise reduction sub-circuit 42 turns on the coupling between the output terminal of the signal amplifying module 22 and the first level signal inputting terminal VGL; and during the signal reading period T3, under the control of the noise reduction control terminal Gate3, the first noise reduction sub-circuit 41 turns off the coupling between the input terminal of the signal amplifying module 22 and the first level signal inputting terminal VGL; and/or, under the control of the noise reduction control terminal Gate3, the second noise reduction sub-circuit 42 turns off the coupling between the output terminal of the signal amplifying module 22 and the first level signal inputting terminal VGL.

The pixel circuit according to the above embodiments includes the first noise reduction sub-circuit 41 and/or the second noise reduction sub-circuit 42, and the method according to the above embodiments is adopted for driving. In this way, the input terminal and/or the output terminal of the signal amplifying module 22 can be coupled to the first level signal inputting terminal VGL in periods other than the signal reading period T3, so that the potential(s) of the input terminal and/or output terminal of the signal amplifying module 22 can be maintained as the potential of the first level signal inputted from the first level signal inputting terminal VGL, which well reduces the internal noise of the signal reading sub-circuit 2.

It should be noted that, the embodiments in the specification are described in a progressive manner, the description of each embodiment focuses on its difference from other embodiments, and reference can be made to other embodiments for the same or similar part. In particular, for the method embodiments, since they are basically similar to the product embodiments, the description is relatively simple, and the relevant part may refer to the description of the product embodiments.

Unless otherwise defined, technical terms or scientific terms used in the present disclosure shall have common meanings understood by those ordinary skilled in the art. Terms such as "first" and "second" in the present disclosure do not indicate any order, quantity or importance, and they are merely used to distinguish different modules. Terms such as "include" or "contain" indicate that an element or object before such terms covers an element, an object or the equivalent enumerated after such terms, and do not exclude other elements and objects. Terms such as "coupled" and "connected" are not used to limit physical or mechanical connection, they may be direct or indirect electrical connection. Terms such as "above", "below", "left" and "right" are merely to describe relative position relationships, and if an absolute position of a described object changes, relative positions with respect to the described object may change correspondingly.

It can be understood that, if an element such as a layer, a film, a region or a substrate is described to be on or below another element, the element may be directly on or below the other element, or there may be an intermediate element between the element and the other element.

Specific features, structures, materials and characteristics in descriptions of the above implementations may be combined properly in one or more embodiments or examples.

The above descriptions merely illustrate some embodiments of the present disclosure, and the protection scope of the present disclosure is not limited thereto. Various modifications and substitutions made by those skilled in the art without departing from the technical scope of the present disclosure shall fall within the protection scope of the present disclosure. Therefore, the protection scope of the present disclosure shall be consistent with the scope defined in the appended claims.

What is claimed is:

1. A pixel circuit, comprising: a signal inputting sub-circuit, a signal reading sub-circuit, and a photosensitive element;
   wherein the signal inputting sub-circuit is coupled to a signal inputting terminal, an inputting control terminal, and a first terminal of the photosensitive element, and is configured to: under control of the inputting control terminal, turn on coupling between the signal inputting terminal and the first terminal of the photosensitive element in a signal writing period, and turn off the coupling between the signal inputting terminal and the first terminal of the photosensitive element in an exposure period and a signal reading period;
   wherein the signal reading sub-circuit is coupled to the first terminal of the photosensitive element, a reading control terminal, and a signal reading terminal, and is configured to: under control of the reading control terminal, turn off coupling between the first terminal of the photosensitive element and the signal reading terminal in the signal writing period and the exposure period, and turn on the coupling between the first terminal of the photosensitive element and the signal reading terminal in the signal reading period; and
   wherein a second terminal of the photosensitive element is coupled to a common electrode signal inputting terminal;
   wherein the signal reading sub-circuit comprises: a signal receiving module, a signal amplifying module, and a signal outputting module; wherein the signal receiving module is coupled to the first terminal of the photosensitive element, the reading control terminal, and an input terminal of the signal amplifying module, and is configured to: under the control of the reading control terminal, turn off the coupling between the first terminal of the photosensitive element and the input terminal of the signal amplifying module in the signal writing period and the exposure period, and turn on the coupling between the first terminal of the photosensitive element and the input terminal of the signal amplifying module in the signal reading period; and wherein the signal outputting module is coupled to an output terminal of the signal amplifying module, the reading control terminal, and the signal reading terminal, and is configured to: under the control of the reading control terminal, turn off the coupling between the output terminal of the signal amplifying module and the signal reading terminal in the signal writing period and the exposure period, and turn on the coupling between the output terminal of the signal amplifying module and the signal reading terminal in the signal reading period;
   wherein the pixel circuit further comprises at least one of the following:
   a first noise reduction sub-circuit, coupled to a noise reduction control terminal, the input terminal of the signal amplifying module, and a first level signal inputting terminal, and configured to: under control of the noise reduction control terminal, turn on coupling between the input terminal of the signal amplifying module and the first level signal inputting terminal in the signal writing period and the exposure period, and turn off the coupling between the input terminal of the signal amplifying module and the first level signal inputting terminal in the signal reading period; or,
   a second noise reduction sub-circuit, coupled to a noise reduction control terminal, the output terminal of the signal amplifying module and a first level signal inputting terminal, and configured to: under control of the noise reduction control terminal, turn on coupling between the output terminal of the signal amplifying module and the first level signal inputting terminal in the signal writing period and the exposure period, and turn off the coupling between the output terminal of the signal amplifying module and the first level signal inputting terminal in the signal reading period.

2. The pixel circuit according to claim 1, wherein the signal amplifying module comprises N transistors, a first electrode of each of the N transistors is coupled to a boost signal inputting terminal, and N is a positive integer greater than or equal to 1;
   wherein a gate electrode of a first transistor of the N transistors serves as the input terminal of the signal amplifying module, and a second electrode of an N-th transistor of the N transistors serves as the output terminal of the signal amplifying module, and among the N transistors, a gate electrode of an X-th transistor is coupled to a second electrode of an (X−1)-th transistor, where $1<X\leq N$; and
   wherein, when N is greater than 1, a width-to-length ratio of a channel of the first transistor to a width-to-length ratio of a channel of the N-th transistor increase successively.

3. The pixel circuit according to claim 1, wherein the signal inputting sub-circuit comprises a signal inputting transistor, a gate electrode of the signal inputting transistor is coupled to the inputting control terminal, a first electrode of the signal inputting transistor is coupled to the signal inputting terminal, and a second electrode of the signal inputting transistor is coupled to the first terminal of the photosensitive element.

4. The pixel circuit according to claim 1, wherein the signal receiving module comprises a signal receiving transistor, a gate electrode of the signal receiving transistor is coupled to the reading control terminal, a first electrode of the signal receiving transistor is coupled to the first terminal of the photosensitive element, and a second electrode of the signal receiving transistor is coupled to the input terminal of the signal amplifying module; and wherein the signal outputting module comprises a signal outputting transistor, a gate electrode of the signal outputting transistor is coupled to the reading control terminal, a first electrode of the signal outputting transistor is coupled to the output terminal of the signal amplifying module, and a second electrode of the signal outputting transistor is coupled to the signal reading terminal.

5. The pixel circuit according to claim 1, wherein the first noise reduction sub-circuit comprises a first noise reduction transistor, a gate electrode of the first noise reduction transistor is coupled to the noise reduction control terminal, a first electrode of the first noise reduction transistor is coupled to the input terminal of the signal amplifying module, and a second electrode of the first noise reduction transistor is coupled to the first level signal inputting terminal.

6. The pixel circuit according to claim 1, wherein the second noise reduction sub-circuit comprises a second noise reduction transistor, a gate electrode of the second noise reduction transistor is coupled to the noise reduction control terminal, a first electrode of the second noise reduction transistor is coupled to the output terminal of the signal amplifying module, and a second electrode of the second noise reduction transistor is coupled to the first level signal inputting terminal.

7. A method for driving a pixel circuit, applied to the pixel circuit according to claim 1, comprising:

in the signal writing period, turning on by the signal inputting sub-circuit under control of the inputting control terminal, the coupling between the signal inputting terminal and the first terminal of the photosensitive element, and turning off by the signal reading sub-circuit under control of the reading control terminal, the coupling between the first terminal of the photosensitive element and the signal reading terminal;

in the exposure period, turning off by the signal inputting sub-circuit under control of the inputting control terminal, the coupling between the signal inputting terminal and the first terminal of the photosensitive element, turning off by the signal reading sub-circuit under control of the reading control terminal, the coupling between the first terminal of the photosensitive element and the signal reading terminal, receiving by the photosensitive element an optical signal, converting the optical signal into an electrical signal, and outputting the electrical signal from the first terminal of the photosensitive element; and in the signal reading period, turning off by the signal inputting sub-circuit under control of the inputting control terminal, the coupling between the signal inputting terminal and the first terminal of the photosensitive element, and turning on by the signal reading sub-circuit under control of the reading control terminal, the coupling between the first terminal of the photosensitive element and the signal reading terminal.

8. An array substrate, comprising a plurality of pixel circuits, wherein each pixel circuit of the plurality of pixel circuits comprises: a signal inputting sub-circuit, a signal reading sub-circuit, and a photosensitive element;

wherein the signal inputting sub-circuit is coupled to a signal inputting terminal, an inputting control terminal, and a first terminal of the photosensitive element, and is configured to: under control of the inputting control terminal, turn on coupling between the signal inputting terminal and the first terminal of the photosensitive element in a signal writing period, and turn off the coupling between the signal inputting terminal and the first terminal of the photosensitive element in an exposure period and a signal reading period;

wherein the signal reading sub-circuit is coupled to the first terminal of the photosensitive element, a reading control terminal, and a signal reading terminal, and is configured to: under control of the reading control terminal, turn off coupling between the first terminal of the photosensitive element and the signal reading terminal in the signal writing period and the exposure period, and turn on the coupling between the first terminal of the photosensitive element and the signal reading terminal in the signal reading period; and wherein a second terminal of the photosensitive element is coupled to a common electrode signal inputting terminal;

wherein the signal reading sub-circuit comprises: a signal receiving module, a signal amplifying module, and a signal outputting module; wherein the signal receiving module is coupled to the first terminal of the photosensitive element, the reading control terminal, and an input terminal of the signal amplifying module, and is configured to: under the control of the reading control terminal, turn off the coupling between the first terminal of the photosensitive element and the input terminal of the signal amplifying module in the signal writing period and the exposure period, and turn on the coupling between the first terminal of the photosensitive element and the input terminal of the signal amplifying module in the signal reading period; and wherein the signal outputting module is coupled to an output terminal of the signal amplifying module, the reading control terminal, and the signal reading terminal, and is configured to: under the control of the reading control terminal, turn off the coupling between the output terminal of the signal amplifying module and the signal reading terminal in the signal writing period and the exposure period, and turn on the coupling between the output terminal of the signal amplifying module and the signal reading terminal in the signal reading period;

wherein each pixel circuit of the plurality of pixel circuits further comprises at least one of the following:

a first noise reduction sub-circuit, coupled to a noise reduction control terminal, the input terminal of the signal amplifying module, and a first level signal inputting terminal, and configured to: under control of the noise reduction control terminal, turn on coupling between the input terminal of the signal amplifying module and the first level signal inputting terminal in the signal writing period and the exposure period, and turn off the coupling between the input terminal of the signal amplifying module and the first level signal inputting terminal in the signal reading period; or, a second noise reduction sub-circuit, coupled to the noise reduction control terminal, the output terminal of the signal amplifying module and the first level signal inputting terminal, and configured to: under control of the noise reduction control terminal, turn on coupling between the output terminal of the signal amplifying module and the first level signal inputting terminal in the signal writing period and the exposure period, and turn off the coupling between the output terminal of the signal amplifying module and the first level signal inputting terminal in the signal reading period.

9. The array substrate according to claim 8, further comprising: a plurality of data signal lines, a plurality of reading signal lines, a plurality of inputting control signal lines and a plurality of reading control signal lines;
- wherein the plurality of pixel circuits is arranged in an array, and is divided into a plurality of rows of pixel circuits and a plurality of columns of pixel circuits;
- wherein the plurality of data signal lines is in a one-to-one correspondence with the plurality of columns of pixel circuits, and each of the plurality of data signal lines is coupled to the signal inputting terminals coupled to the pixel circuits included in the corresponding column;
- wherein the plurality of reading signal lines is in a one-to-one correspondence with the plurality of columns of pixel circuits, and each of the plurality of reading signal lines is coupled to the signal reading terminals coupled to the pixel circuits included in the corresponding column;
- wherein the plurality of inputting control signal lines is in a one-to-one correspondence with the plurality of rows of pixel circuits, and each of the plurality of inputting control signal lines is coupled to the inputting control terminals coupled to the pixel circuits included in the corresponding row; and
- wherein the plurality of reading control signal lines is in a one-to-one correspondence with the plurality of rows of pixel circuits, and each of the plurality of reading control signal lines is coupled to the reading control terminals coupled to the pixel circuits included in the corresponding row.

10. The array substrate according to claim 9, further comprising: a plurality of noise reduction control signal lines, a plurality of common electrode signal inputting lines, a plurality of boost signal inputting lines, and a plurality of first level signal inputting lines;
- wherein the plurality of noise reduction control signal lines is in a one-to-one correspondence with the plurality of rows of pixel circuits, and each of the plurality of noise reduction control signal lines is coupled to the noise reduction control terminals coupled to the pixel circuits included in the corresponding row;
- wherein the plurality of common electrode signal inputting lines is in a one-to-one correspondence with the plurality of rows of pixel circuits, and each of the plurality of common electrode signal inputting lines is coupled to the common electrode signal inputting terminals coupled to the pixel circuits included in the corresponding row;
- wherein the plurality of boost signal inputting lines is in a one-to-one correspondence with the plurality of rows of pixel circuits, and each of the plurality of boost signal inputting lines is coupled to the boost signal inputting terminals coupled to the pixel circuits included in the corresponding row; and
- wherein the plurality of first level signal inputting lines is in a one-to-one correspondence with the plurality of rows of pixel circuits, and each of the plurality of first level signal inputting lines is coupled to the first level signal inputting terminals coupled to the pixel circuits included in the corresponding row.

11. The array substrate according to claim 8, wherein the signal amplifying module comprises N transistors, a first electrode of each of the N transistors is coupled to a boost signal inputting terminal, and N is a positive integer greater than or equal to 1;
- wherein a gate electrode of a first transistor of the N transistors serves as the input terminal of the signal amplifying module, and a second electrode of an N-th transistor of the N transistors serves as the output terminal of the signal amplifying module, and among the N transistors, a gate electrode of an X-th transistor is coupled to a second electrode of an (X−1)-th transistor, where $1<X\leq N$; and
- wherein, when N is greater than 1, a width-to-length ratio of a channel of the first transistor to a width-to-length ratio of a channel of the N-th transistor increase successively.

12. The array substrate according to claim 8, wherein the signal inputting sub-circuit comprises a signal inputting transistor, a gate electrode of the signal inputting transistor is coupled to the inputting control terminal, a first electrode of the signal inputting transistor is coupled to the signal inputting terminal, and a second electrode of the signal inputting transistor is connected to the first terminal of the photosensitive element is coupled;
- wherein the signal receiving module comprises a signal receiving transistor, a gate electrode of the signal receiving transistor is coupled to the reading control terminal, a first electrode of the signal receiving transistor is coupled to the first terminal of the photosensitive element, and a second electrode of the signal receiving transistor is coupled to the input terminal of the signal amplifying module; and
- wherein the signal outputting module comprises a signal outputting transistor, a gate electrode of the signal outputting transistor is coupled to the reading control terminal, a first electrode of the signal outputting transistor is coupled to the output terminal of the signal amplifying module, and a second electrode of the signal outputting transistor is coupled to the signal reading terminal.

13. The array substrate according to claim 8, wherein the first noise reduction sub-circuit comprises a first noise reduction transistor, a gate electrode of the first noise reduction transistor is coupled to the noise reduction control terminal, a first electrode of the first noise reduction transistor is coupled to the input terminal of the signal amplifying module, and a second electrode of the first noise reduction transistor is coupled to the first level signal inputting terminal.

14. The array substrate according to claim 8, wherein the second noise reduction sub-circuit comprises a second noise reduction transistor, a gate electrode of the second noise reduction transistor is coupled to the noise reduction control terminal, a first electrode of the second noise reduction transistor is coupled to the output terminal of the signal amplifying module, and a second electrode of the second noise reduction transistor is coupled to the first level signal inputting terminal.

15. A pixel circuit, comprising: a signal inputting sub-circuit, a signal reading sub-circuit, and a photosensitive element;

wherein the signal inputting sub-circuit is coupled to a signal inputting terminal, an inputting control terminal, and a first terminal of the photosensitive element, and is configured to: under control of the inputting control terminal, turn on coupling between the signal inputting terminal and the first terminal of the photosensitive element in a signal writing period, and turn off the coupling between the signal inputting terminal and the first terminal of the photosensitive element in an exposure period and a signal reading period;

wherein the signal reading sub-circuit is coupled to the first terminal of the photosensitive element, a reading control terminal, and a signal reading terminal, and is configured to: under control of the reading control terminal, turn off coupling between the first terminal of the photosensitive element and the signal reading terminal in the signal writing period and the exposure period, and turn on the coupling between the first terminal of the photosensitive element and the signal reading terminal in the signal reading period; and wherein a second terminal of the photosensitive element is coupled to a common electrode signal inputting terminal;

wherein the signal reading sub-circuit comprises: a signal receiving module, a signal amplifying module, and a signal outputting module; wherein the signal receiving module is coupled to the first terminal of the photosensitive element, the reading control terminal, and an input terminal of the signal amplifying module, and is configured to: under the control of the reading control terminal, turn off the coupling between the first terminal of the photosensitive element and the input terminal of the signal amplifying module in the signal writing period and the exposure period, and turn on the coupling between the first terminal of the photosensitive element and the input terminal of the signal amplifying module in the signal reading period; and wherein the signal outputting module is coupled to an output terminal of the signal amplifying module, the reading control terminal, and the signal reading terminal, and is configured to: under the control of the reading control terminal, turn off the coupling between the output terminal of the signal amplifying module and the signal reading terminal in the signal writing period and the exposure period, and turn on the coupling between the output terminal of the signal amplifying module and the signal reading terminal in the signal reading period;

wherein the signal amplifying module comprises N transistors, a first electrode of each of the N transistors is coupled to a boost signal inputting terminal, and N is a positive integer greater than or equal to 1; wherein a gate electrode of a first transistor of the N transistors serves as the input terminal of the signal amplifying module, and a second electrode of an N-th transistor of the N transistors serves as the output terminal of the signal amplifying module, and among the N transistors, a gate electrode of an X-th transistor is coupled to a second electrode of an $(X-1)$-th transistor, where $1<X\leq N$; and wherein, when N is greater than 1, a width-to-length ratio of a channel of the first transistor to a width-to-length ratio of a channel of the N-th transistor increase successively.

16. The pixel circuit according to claim 15, wherein the signal inputting sub-circuit comprises a signal inputting transistor, a gate electrode of the signal inputting transistor is coupled to the inputting control terminal, a first electrode of the signal inputting transistor is coupled to the signal inputting terminal, and a second electrode of the signal inputting transistor is coupled to the first terminal of the photosensitive element.

17. The pixel circuit according to claim 15, wherein the signal receiving module comprises a signal receiving transistor, a gate electrode of the signal receiving transistor is coupled to the reading control terminal, a first electrode of the signal receiving transistor is coupled to the first terminal of the photosensitive element, and a second electrode of the signal receiving transistor is coupled to the input terminal of the signal amplifying module; and wherein the signal outputting module comprises a signal outputting transistor, a gate electrode of the signal outputting transistor is coupled to the reading control terminal, a first electrode of the signal outputting transistor is coupled to the output terminal of the signal amplifying module, and a second electrode of the signal outputting transistor is coupled to the signal reading terminal.

* * * * *